United States Patent
Yamamoto (10) Patent No.: US 7,746,479 B2
(45) Date of Patent: Jun. 29, 2010

(54) WAVEFRONT-ABERRATION MEASURING DEVICE AND EXPOSURE APPARATUS INCLUDING THE DEVICE

(75) Inventor: Kazuki Yamamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/409,295

(22) Filed: Mar. 23, 2009

(65) Prior Publication Data

US 2009/0185194 A1    Jul. 23, 2009

Related U.S. Application Data

(63) Continuation of application No. 11/418,990, filed on May 4, 2006.

(30) Foreign Application Priority Data

May 17, 2005    (JP) .............................. 2005-143922

(51) Int. Cl.
    *G01B 11/02*    (2006.01)
(52) U.S. Cl. ..................................... 356/515
(58) Field of Classification Search ................. 356/489, 356/495, 511–515, 521
    See application file for complete search history.

(56) References Cited

U.S. PATENT DOCUMENTS

| 6,111,646 | A  | * | 8/2000  | Naulleau et al. ............ 356/494 |
| 6,307,635 | B1 | * | 10/2001 | Goldberg ..................... 356/521 |
| 2003/0025908 | A1 | * | 2/2003 | Taniguchi et al. ........... 356/399 |

* cited by examiner

*Primary Examiner*—Tarifur Chowdhury
*Assistant Examiner*—Jonathan M Hansen
(74) *Attorney, Agent, or Firm*—Canon U.S.A., Inc. I.P. Division (57) ABSTRACT

A measuring device for measuring a wavefront aberration of an optical system includes a first mask for defining light that enters the optical system, and a second mask having first to fourth openings. The first opening transmits a component of the light passing through the optical system without removing information about the wavefront aberration of the optical system, and the second to fourth openings transmit components of the light passing through the optical system having the information about the wavefront aberration of the optical system removed.

11 Claims, 8 Drawing Sheets

WAVEFRONT-ABERRATION MEASURING DEVICE AND EXPOSURE APPARATUS INCLUDING THE DEVICE

CROSS-REFERENCE TO RELATED APPLICATIONS

This application is a continuation of U.S. patent application Ser. No. 11/418,990 filed May 4, 2006, which claims priority to Japanese Patent Application No. 2005-143922 filed on May 17, 2005, each of which is hereby incorporated by reference herein in its entirety.

BACKGROUND OF THE INVENTION

1. Field of the Invention

The present invention relates to a device for measuring the performance of an optical member, and more particularly, to a device for measuring the wavefront aberration of a projection optical system that projects a pattern image of a reticle onto a substrate.

2. Description of the Related Art

Projection exposure apparatuses have been used in which a photosensitive substrate is exposed with a pattern provided on a reticle (photomask) when devices, such as semiconductor devices or liquid crystal display elements, are manufactured by photolithography. It is important that the projection exposure apparatuses use a projection optical system that has high imaging performance and provides little aberration, because the pattern on the reticle is required to be precisely transferred onto the photosensitive substrate at a predetermined reduction ratio. Particularly, transfer patterns have become more sensitive to aberration of the optical system in order to meet recent demands for finer semiconductor devices. For this reason, it is necessary to precisely measure optical performance (e.g., wavefront aberration) of the projection optical system. Further, it is important to simplify and speed up the measurement and to reduce the cost from the viewpoints of productivity and economic efficiency.

In a known measuring method, a pattern of a reticle is actually transferred onto a wafer, and a resist image of the pattern is observed and inspected with a scanning electron microscope. However, the measuring time is long, and inspection reproducibility is low because of errors resulting from resist application and development. In order to overcome these problems, a point diffraction interferometer (PDI) including a pinhole for forming an ideal spherical wave and a shearing interferometer (or a Talbot interferometer) using shearing interference have been proposed. Further, a line diffraction interferometer (LDI) has been recently proposed which has a slit for forming an ideal spherical wave only in a one-dimensional direction (for example, see Japanese Patent Laid-Open Nos. 2000-146705 and 2000-097666).

In a measuring device that measures the wavefront aberration with a PDI, a mask having a pinhole for forming light having an ideal spherical wavefront as a reference wavefront, and a window, through which light having a wavefront containing aberration information about an optical system to be measured passes, is placed behind the optical system. An image of an interference pattern (interference fringes) produced between the wavefront of light passing through the pinhole and the wavefront of light passing through the window is captured by an imaging element, and is processed to calculate a wavefront aberration of the optical system. In a measuring device that measures the wavefront aberration with an LDI, a mask having a slit for forming light having an ideal spherical wavefront only in a one-dimensional direction as a reference wavefront, and a window, through which light having a wavefront containing aberration information about an optical system to be measured passes, is placed behind the optical system. An image of an interference pattern (interference fringes) produced between the wavefront of light from the slit and the wavefront of light from the window is captured by an imaging element, and is processed to calculate a wavefront aberration of the optical system.

In these measuring devices for measuring a wavefront aberration, in general, the ideal wavefront is spherical, or spherical only in a one-dimensional direction, and a light-receiving surface of the imaging element for detecting the wavefront is flat. Therefore, the wavefront aberration obtained by analysis contains not only aberration of the optical system, but also an aberration component resulting from the detection of the spherical wavefront with such an imaging element. In order to remove the aberration component resulting from the spherical wavefront, for example, it is conceivable to place a Fourier transform lens directly before the light-receiving surface of the imaging element so that substantially parallel light enters the light-receiving surface, or to subject the interference pattern to specific processing.

In these methods, however, an additional aberration component is sometimes produced by manufacturing error of the Fourier transform lens or precision error in image processing (e.g., precision error in determination of a processing area).

A mask having a pinhole (or a slit) and a window is obtained, for example, by forming a chromium film on a transparent substrate made of quartz. However, it is difficult to remove an aberration component resulting from the thickness of the substrate, an aberration component resulting from the displacement (particularly in the height direction) of the imaging element, and an aberration component resulting from manufacturing error of the interferometer. In particular, when the wavefront aberration of a projection optical system having a high numerical aperture (NA) is measured precisely, an aberration component resulting from the manufacturing error of the interferometer is increased.

SUMMARY OF THE INVENTION

A measuring device according to an aspect of the present invention measures a wavefront aberration of an optical system. The measuring device includes a first mask for defining light that enters the optical system; a second mask including first, second, third, and fourth openings (apertures), the first opening transmitting a component of the light passing through the optical system without removing information about the wavefront aberration of the optical system, and the second to fourth openings transmitting components of the light passing through the optical system having the information about the wavefront aberration of the optical system removed; a detector for detecting an interference pattern formed by interference between components of the light passing through two of the first to fourth openings; and a controller for correcting an interference pattern formed by interference between the light component passing through the first opening and the light component passing through the second opening and detected by the detector on the basis of an interference pattern formed by interference between the light component passing through the third opening and the light component passing through the fourth opening and detected by the detector.

An exposure apparatus according to another aspect of the present invention includes a projection optical system that projects a pattern image of a reticle onto a substrate, and a measuring device that measures a wavefront aberration of the projection optical system. The measuring device includes a first mask for defining light that enters the optical system; a second mask including first, second, third, and fourth openings, the first opening transmitting a component of the light passing through the optical system without removing information about the wavefront aberration of the optical system, and the second to fourth openings transmitting components of the light passing through the optical system having the information about the wavefront aberration of the optical system removed; a detector for detecting an interference pattern formed by interference between components of the light passing through two of the first to fourth openings; and a controller for correcting an interference pattern formed by interference between the light component passing through the first opening and the light component passing through the second opening and detected by the detector on the basis of an interference pattern formed by interference between the light component passing through the third opening and the light component passing through the fourth opening and detected by the detector.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Embodiments of the present invention will be described in detail below with reference to the attached drawings.

First Embodiment

Figure 1:
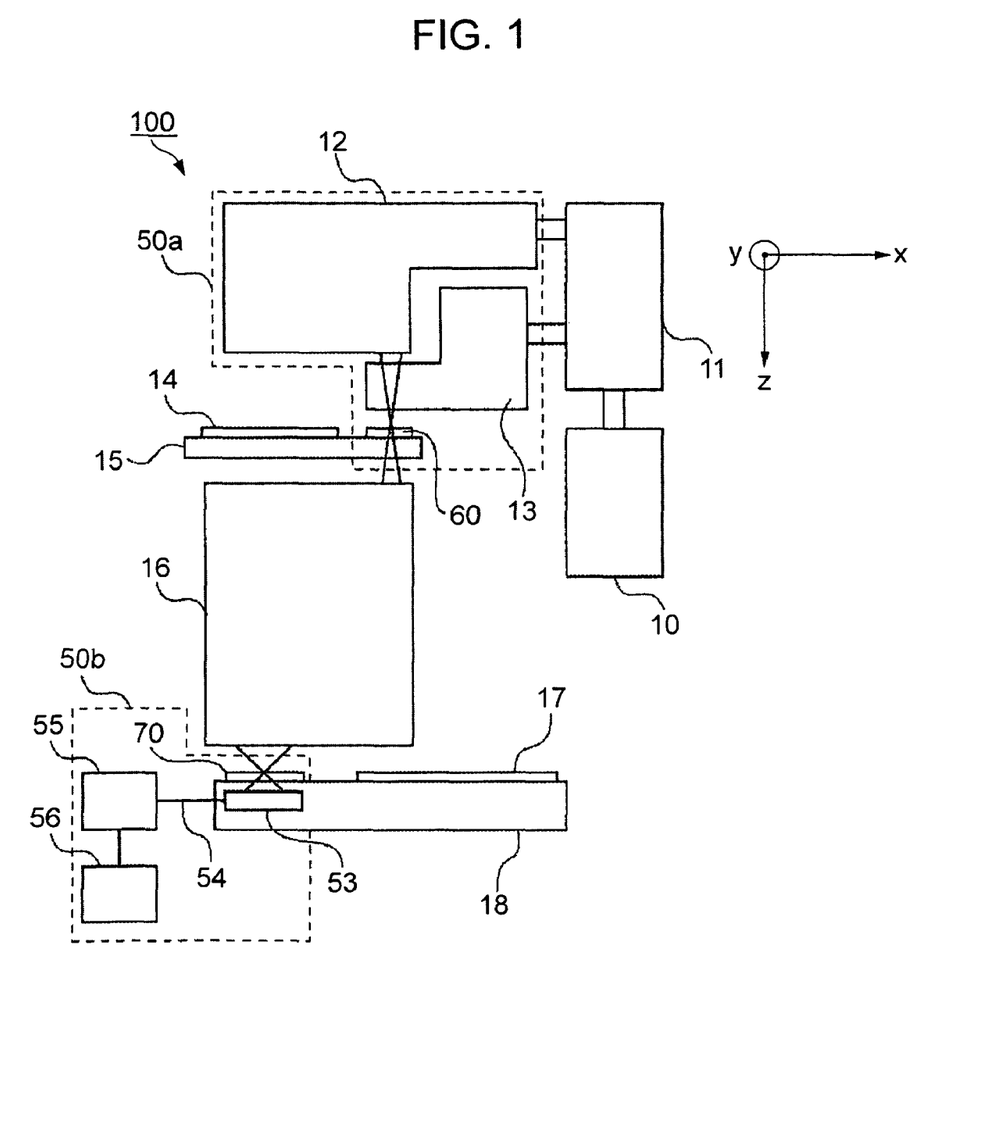
FIG. 1 is a schematic block diagram of an exposure apparatus according to a first embodiment of the present invention.

An exposure apparatus 100 including a PDI measuring device according to a first embodiment of the present invention will be described below with reference to the attached drawings. FIG. 1 is a schematic block diagram of the exposure apparatus 100.

The exposure apparatus 100 is, for example, a projection exposure apparatus that transfers a circuit pattern provided on a reticle 14 (photomask) onto a substrate 17 serving as a photosensitive substrate by exposure in a step-and-scan manner. The exposure apparatus 100 includes a measuring device (50a, 50b), an illumination device, an alignment optical system 13, and a projection optical system 16.

The illumination device illuminates the reticle 14 on which the circuit pattern is provided, and includes a light source 10, a routing optical system 11, and an illumination optical system 12. The light source 10 may be, for example, an ArF excimer laser with a wavelength of approximately 193 nm, or a KrF excimer laser with a wavelength of approximately 248 nm. When the light source 10 emits laser light, it is preferable to adopt a beam-shaping optical system for shaping a parallel light beam from the light source 10 into a desired beam form, and an incoherent optical system for converting a coherent laser beam into an incoherent laser beam.

The illumination optical system 12 illuminates the reticle 14, and includes, for example, a lens, a mirror, an optical integrator, and a σ-stop (aperture stop). The routing optical system 11 deflects and guides a light beam from the light source 10 to the illumination optical system 12 and the alignment optical system 13.

The alignment optical system 13 forms an alignment scope, and is placed outside the optical path during normal exposure operation. A driving mechanism for driving the alignment optical system 13 is not shown in FIG. 1. The alignment scope obtains the relative positions of the reticle 14 and a stage 18 on the basis of an image of an alignment mark (not shown) provided on the reticle 14 or a reticle stage 15 and an image of an alignment mark on the stage 18 that is formed via the projection optical system 16.

The reticle 14 is made of, for example, quartz, and a circuit pattern to be transferred is provided on a surface of the reticle 14. The reticle 14 is supported and driven by the reticle stage 15. Diffracted light is applied from the pattern of the reticle 14 onto the substrate 17 via the projection optical system 16. The reticle 14 and the substrate 17 are arranged in an optically conjugate relationship. Since the exposure apparatus 100 of the first embodiment is a step-and-scan exposure apparatus, the pattern of the reticle 14 is transferred onto the substrate 17 by scanning the reticle 14 and the substrate 17 at the speed ratio in accordance with the reduction ratio.

The projection optical system 16 can adopt a refracting optical system including only a plurality of lenses, a reflecting and refracting optical system including a plurality of lenses and at least one concave mirror, or a reflecting optical system including only a plurality of mirrors. In the optical systems, the lenses may be replaced with diffraction optical elements. The optical performance (e.g., wavefront aberration) of the projection optical system 16 is measured with the measuring device (50a, 50b).

The substrate 17 is a photosensitive substrate such as a wafer or a glass plate, and a photoresist is applied thereon. The substrate 17 is placed on the stage 18 by a chuck (not shown). The stage 18 supports the substrate 17 and a part (50b) of the measuring device. For example, the stage 18 can move the substrate 17 and the part 50b of the measuring device in the x- and y-directions by using a linear motor (not shown). The reticle 14 and the substrate 17 are, for example, synchronously scanned. After the positions of the stage 18 and the reticle stage 15 are subjected to calibration by the alignment optical system 13, the stage 18 and the reticle stage 15 are driven at a fixed speed ratio by using an interferometer (not shown).

The measuring device (50a, 50b) shown in FIG. 1 includes the illumination optical system 12 (or the alignment optical system 13), a first mask 60, a second mask 70, an image sensor 53 serving as a detector, a communication cable 54, a controller 55, and a memory 56. In the first embodiment, the measuring device (50a, 50b) also includes an interferometer (PDI) that measures the optical performance of the projection optical system 16 serving as an optical system to be measured by detecting an interference pattern (interference fringes).

The first mask 60 is provided on a substrate placed on the reticle stage 15. The substrate is formed of, for example, a transparent substrate of quartz or fluorite, and the first mask 60 disposed on the substrate is made of, for example, chromium. It is not always necessary that the substrate having the reticle 14 and the first mask 60 is placed (or fixed) on the reticle stage 15 in this way. That is, a substrate (measuring reticle) on which the first mask 60 is provided may be placed on the reticle stage 15 instead of the reticle 14 only during measurement of the wavefront aberration.

A light beam from the illumination optical system 12 is collected onto the first mask 60 disposed on the reticle stage 15. The numerical aperture NA of the light collected on the first mask 60 is equal to the numerical aperture NAo of the projection optical system 16 on the reticle side, that is, on the object side, and illumination is performed in a relationship σ=1. Herein, σ represents the ratio of NA of light incident on the projection optical system 16 and NA of the projection optical system 16.

Figure 2:
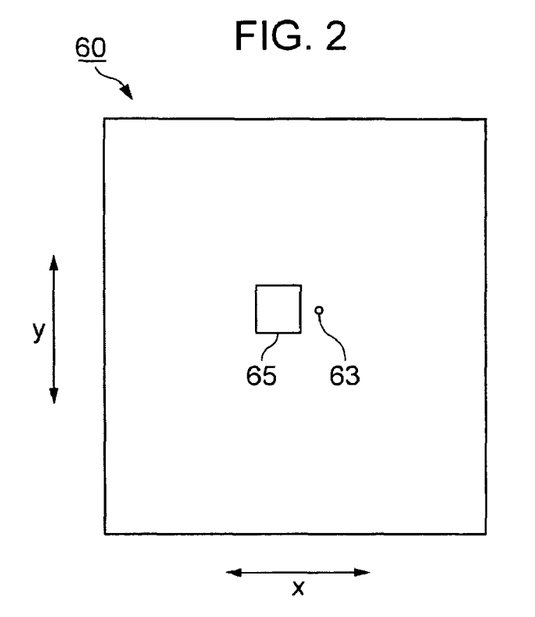
FIG. 2 is a schematic plan view of a first mask in the first embodiment.

FIG. 2 is a schematic plan view showing the structure of the first mask 60. The first mask 60 includes a pinhole 63 and a window 65. The diameter $\Delta_r$ of the pinhole 63 satisfies the following Conditional Expression 1:

$$\Delta_r < 0.5 \times \lambda / NA_r \tag{1}$$

where $NA_r$ represents the numerical aperture of the projection optical system 16 on the reticle side, that is, on the object side.

By determining the diameter $\Delta_r$ of the pinhole 63 to satisfy Conditional Expression 1, diffracted light from the pinhole 63 can be considered to be equiphase with respect to the numerical aperture $NA_r$. While the width $\Delta_{r'}$ of the window 65 may be equivalent to the diameter $\Delta_r$ of the pinhole 63, it is set to be a little larger from the viewpoint of the light amount, because light passing through the window 65 then passes through a pinhole, which has a width such as to satisfy Conditional Expression 2, on the side of the substrate 17, as will be described below, and the light does not need to be equiphase on the reticle side.

Figure 3:
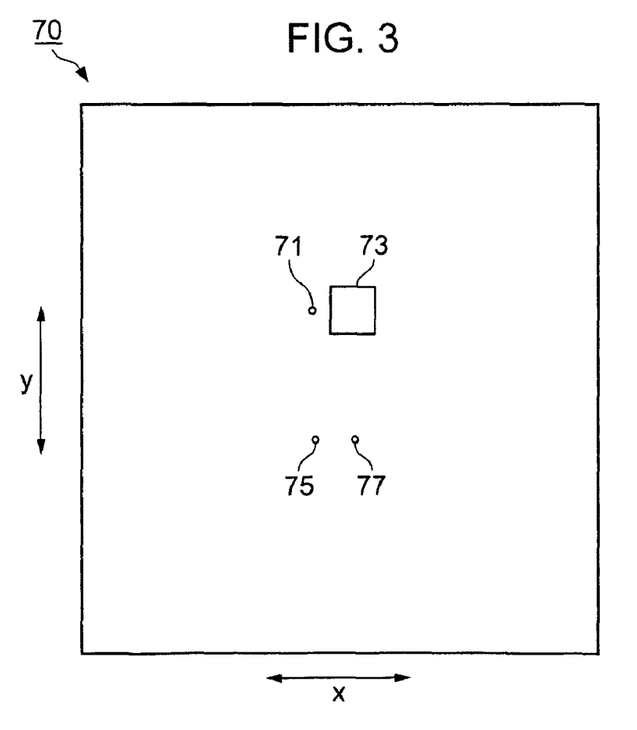
FIG. 3 is a schematic plan view of a second mask in the first embodiment.

FIG. 3 is a schematic plan view of the second mask 70. As shown in FIG. 3, the second mask 70 includes a combination of a pinhole 71 and a window 73, and a pair of pinholes 75 and 77. The distance between the pinhole 71 and the window 73 is equal to the distance between the pinhole 75 and the pinhole 77. The diameter $\Delta_w$ of the pinholes 71, 75, and 77 satisfies the following Conditional Expression 2:

$$\Delta_w < 0.5 \times \lambda / NA_s \tag{2}$$

where $NA_s$ represents the numerical aperture of the projection optical system 16 on the side of the substrate 17, that is, on the image side.

By setting the diameter of the pinholes 71, 75, and 77 to satisfy Conditional Expression 2, diffracted light from the pinholes can be considered to be equiphase with respect to the range of NAs.

The width $\Delta_{w'}$ of the window 73 is determined in accordance with the spatial frequency of the wavefront aberration of a projection optical system to be measured. The width $\Delta_{w'}$ is set to be large in order to measure spatial frequencies including high frequencies, and to be small in order to measure only low frequencies. The width $\Delta_{w'}$ is given by the following Expression 3:

$$\Delta_{w'} = 2 \times f \times \lambda / NA_s \tag{3}$$

where f represents the spatial frequency of the wavefront aberration in the pupil of the projection optical system 16 to be measured.

When the pupil radius corresponds to one cycle, the spatial frequency f is 1.

The image sensor 53 is an optoelectric transducer such as a CCD, and detects interference fringes formed by two light beams passing through the pinhole 71 and the window 73. The cable 54 connects the image sensor 53 to the controller 55 so that communication therebetween is possible. The controller 55 acquires phase information from the output of the image sensor 53. The memory 56 stores a measuring method shown in FIG. 4, which will be described below, a processing method in which the controller 55 acquires phase information from the output of the image sensor 53, the phase information acquired by the controller 55, a control method used by the controller 55, and other data. While the three pinholes 71, 75, and 77 are provided in the second mask 70 in the first embodiment, when the pinhole 75 is provided near the pinhole 71, the pinhole 77 can be omitted.

Operation of the measuring device (50a, 50b) will be described below with reference to FIG. 4 serving as a flowchart.

First, Step 1002 for measuring the offset wavefront aberration will be described. Referring to FIG. 1, a light beam emitted from the light source 10 is routed to the illumination optical system 12 by the routing optical system 11. The shape of the light beam from the routing optical system 11 is adjusted by the σ-stop disposed at the pupil plane of the illumination optical system 12 and a masking means disposed on a plane that is conjugate with the reticle in the illumination optical system 12 so that the light beam properly illuminates the first mask 60.

In Step 1002, a driving mechanism (not shown) relatively moves the reticle stage 15 so that the light beam from the illumination optical system 12 is applied to the pinhole 63 and the window 65.

Since the pinhole 63 has a diameter such as to satisfy the above-described Conditional Expression 1, diffracted light having a spherical equiphase wavefront comes from the pinhole 63. Therefore, the light is applied onto the entire pupil plane of the projection optical system 16. In contrast, the light beam passing through the window 65 contains aberration of the illumination optical system 12. The pinhole 63 and the window 65 of the first mask 60 are imaged onto the second mask 70 placed on the stage 18 by the projection optical system 16. The position of the second mask 70 is adjusted by driving the stage 18 so that the pinhole 63 and the window 65 of the first mask 60 are respectively imaged onto the pinhole 77 and the pinhole 75 of the second mask 70.

Figure 5:
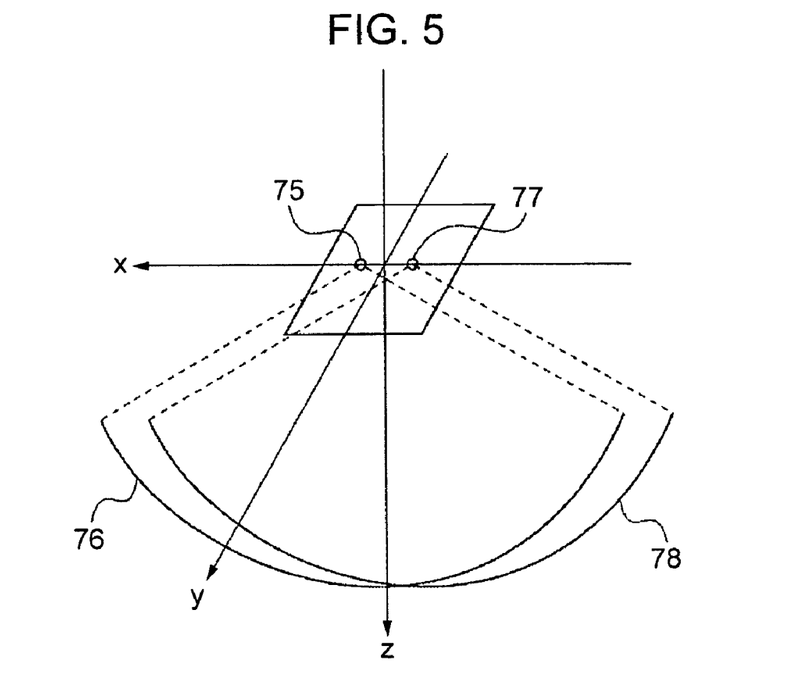
FIG. 5 is a schematic view of light emitted from two pinholes of the second mask.

Each of the light beams diffracted by the pinholes 75 and 77 has a spherical equiphase wavefront. FIG. 5 is a schematic view showing light beams emitted from the pinholes 75 and 77. FIG. 5 shows that light beam passing through the pinhole 75 and light beam passing through the pinhole 77 have ideal spherical wavefronts 76 and 78, respectively.

An interference pattern produced by the light beams from the pinholes 75 and 77 is transmitted from the image sensor 53 to the controller 55 via the cable 54, and the controller 55 acquires phase information. Phase information is calculated from the interference pattern, for example, by Fourier transform or an electronic Moiré method.

In Fourier transform, spatial frequency regions containing information about measured wavefront information are obtained by subjecting one interference pattern to two-dimensional Fourier transform, and are subjected to origin shifting, and then to inversed Fourier transform, thereby acquiring phase information.

In an electronic Moiré method, at least three reference Moire patterns are formed which have the same carrier frequency as that of one measured interference pattern and which are subjected to phase shifting. At least three Moiré patterns are produced from the measured interference pattern and the reference Moire patterns, are passed through a low-pass filter, and are subjected to phase shifting, thereby acquiring phase information.

When the electronic Moiré method is used, it is possible to multiply the measured interference pattern by reference Moire patterns created by the controller 55 or prestored in the memory 56.

The wavefront aberration calculated in Step 1002 contains, for example, an aberration component produced by the ideal spherical waves emitted from the pinholes, and an aberration component produced by a medium that lies between the second mask 70 and the image sensor 53. Further, aberration information about the projection optical system 16 is not reflected in the calculated wavefront aberration. This wavefront aberration is referred to as an offset wavefront aberration.

In Step 1004, a measured wavefront aberration, containing aberration information about the projection optical system 16, is obtained. Similarly to Step 1002, a light beam emitted from the light source 10 is routed to the illumination optical system 12 by the routing optical system 11. The light beam from the routing optical system 11 is adjusted by the masking means in the illumination optical system 12 so as to be applied to the pinhole 63 and the window 65 of the first mask 60.

Since the pinhole 63 has a diameter such as to satisfy the above-described Conditional Expression 1, diffracted light having a spherical equiphase wavefront comes from the pinhole 63. Therefore, the light is applied onto the entire pupil plane of the projection optical system 16. In contrast, the light beam passing through the window 65 contains aberration of the illumination optical system 12. The pinhole 63 and the window 65 of the first mask 60 are imaged onto the second mask 70 placed on the stage 18 by the projection optical system 16. The position of the second mask 70 is adjusted by driving the stage 18 so that the pinhole 63 and the window 65 of the first mask 60 are respectively imaged on the window 73 and the pinhole 71 of the second mask 70.

Figure 6:
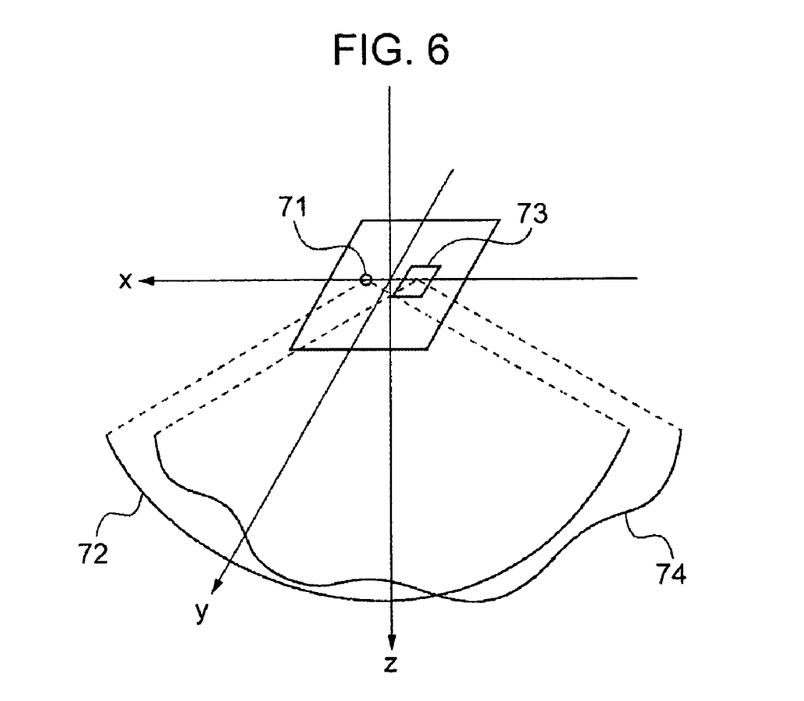
FIG. 6 is a schematic view of light emitted from a pinhole and a window of the second mask.

The light diffracted by the pinhole 71 has a spherical equiphase wavefront. In contrast, the light, whose wavefront is shaped by the pinhole 63 to be equiphase and which passes through the projection optical system 16, passes through the window 73. Therefore, the light contains information about the wavefront aberration of the projection optical system 16. FIG. 6 is a schematic view showing light emitted from the pinhole 71 and the center of the window 73. FIG. 6 shows that light passing through the pinhole 71 has an ideal spherical wavefront 72, and that light passing through the window 73 has a measured wavefront 74.

For this reason, a wavefront aberration in which aberration information about the projection optical system 16 is reflected can be obtained by finding phase information on the basis of an interference pattern captured by the image sensor 53.

Figure 7:
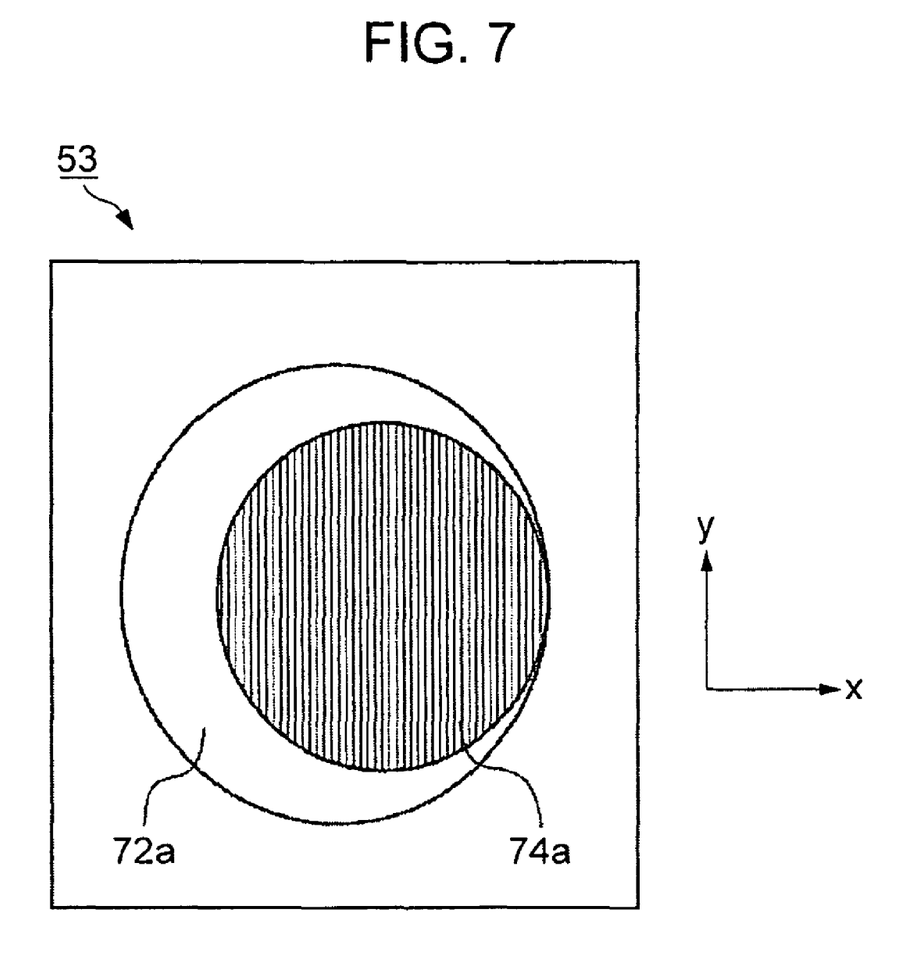
FIG. 7 is a schematic plan view showing an example of an interference pattern produced by light emitted from the pinhole and the window of the second mask.

FIG. 7 shows an example of an interference pattern that is produced by light beams passing through the pinhole 71 and the center of the window 73 and that is detected by the image sensor 53. Two images corresponding to the pupil of the projection optical system 16, whose centers are offset from each other by an amount corresponding to the distance between the pinhole 71 and the window 73, are captured, and a pattern of interference fringes is produced in an area common to the images.

The captured interference pattern is transmitted from the image sensor 53 to the controller 55 via the cable 54. The controller 55 acquires phase information from the interference pattern by the above-described method, for example, Fourier transform or an electronic Moiré method.

The wavefront aberration (measured wavefront aberration) calculated in Step 1004 contains not only an x-direction aberration of the projection optical system 16, but also an aberration component produced by the ideal spherical wavefront of the light emitted from the pinholes, and an aberration component produced by the medium lying between the second mask 70 and the image sensor 53.

In Step 1006, the measured wavefront aberration calculated in Step 1004 is corrected on the basis of the offset wavefront aberration calculated in Step 1002, and the aberration components that do not result from the projection optical system 16 are removed. In actual correction, for example, the value of the offset wavefront aberration at each position is subtracted from the value of the measured wavefront aberration. Alternatively, each of the measured wavefront aberration and the offset wavefront aberration is expressed in a Zernike polynomial, and subtraction is performed with respect to each term of the Zernike polynomial. Consequently, the wavefront aberration containing only the aberration information about the projection optical system 16 can be obtained precisely.

While Steps 1002 to 1006 have been described above, when measurement is repeated a plurality of times, for example, when the wavefront aberration is measured every time each of one lot of wafers is subjected to exposure, it is unnecessary to perform all the steps in each measurement operation.

For example, all the steps do not need to be performed within a period in which it can be considered that the state of the measuring device does not change with time and that aberration resulting from the ideal spherical wavefront of light emitted from the pinholes and aberration resulting from the medium lying between the mask 70 and the image sensor 53 do also not change. That is, Step 1002 is performed only once, and data on an offset wavefront aberration is stored in the memory 56. When Step 1006 is performed, the data is extracted from the memory 56. In this method, Step 1004 can be omitted.

Alternatively, the measuring time can be further reduced by an electronic Moiré measuring method using reference Moire patterns containing offset aberration information. The electronic Moiré measuring method will be described in detail with reference to FIG. 8 serving as a flowchart.

Figure 8:
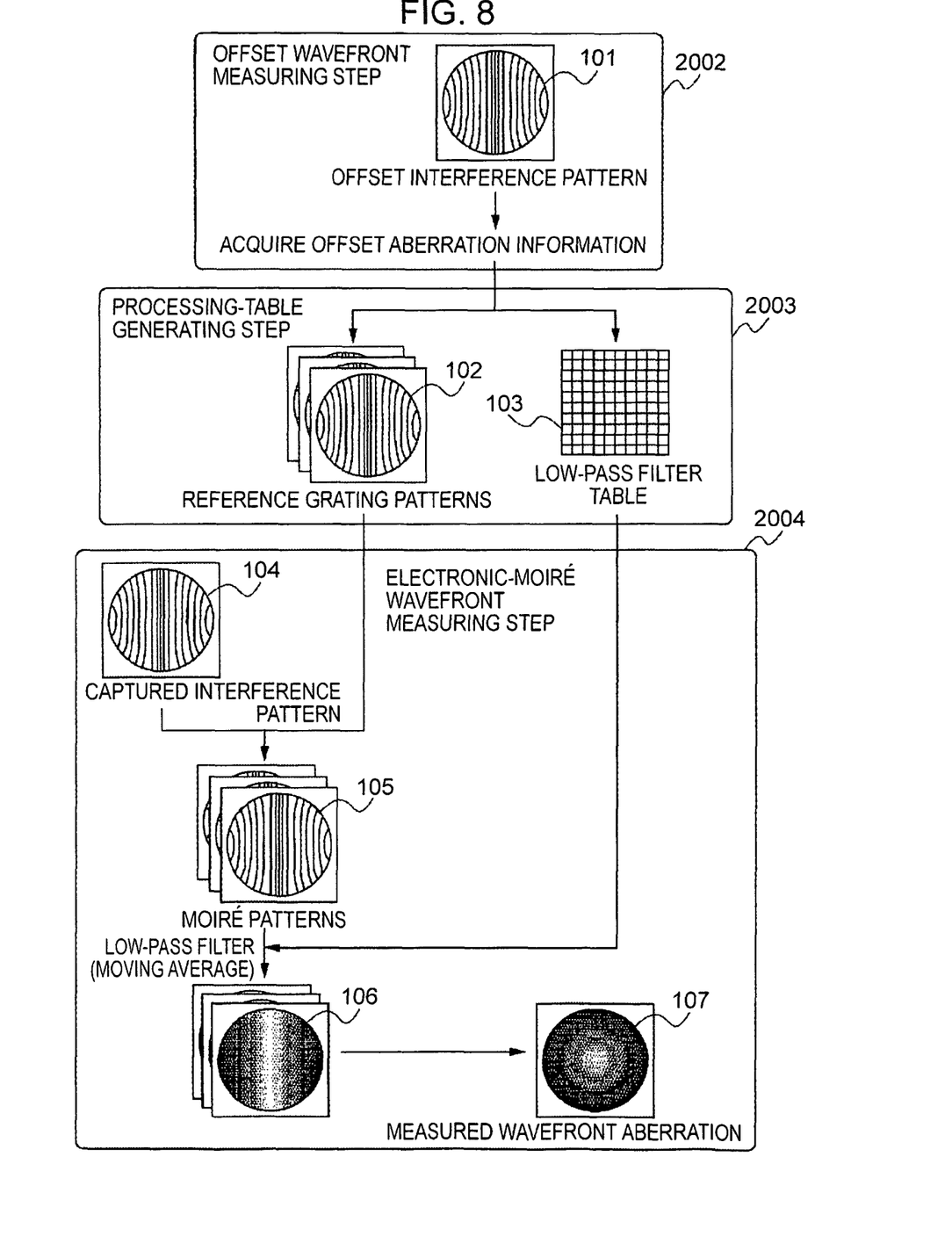
FIG. 8 is a conceptual view of an electronic Moiré measuring method in which offset information is added to reference Moiré patterns.

Referring to FIG. 8, offset wavefront aberration information is calculated from a captured offset interference pattern 101 in an offset wavefront measuring step (Step 2002).

In a processing-table generating step (Step 2003), a plurality of reference Moire patterns 102 having different initial phases and a table 103 corresponding to a spatial-frequency-variable low-pass filter in which the spatial frequency varies among pixels are generated on the basis of the offset wavefront aberration information calculated in Step 2002. The table 103 is stored in the memory 56.

The table 103 of the spatial-frequency-variable low-pass filter includes, as a pixel value, the moving average width that varies depending on the pixel position. The moving average can be calculated by detecting the interval of the pixels in each row, which causes a phase shift of 2Π, in the offset wavefront aberration (phase information) obtained from the offset interference pattern 101, and considering the detected number of pixels the moving average width (pixel value) at the pixel position. Alternatively, the number of pixels corresponding to the fringe interval at each pixel position in the offset interference pattern 101 may be detected by subjecting the offset interference pattern 101 to image processing such as edge detection and segment detection, and the detected number of pixels may be considered the moving average width at the pixel position.

In an electronic-Moiré wavefront measuring step (Step 2004), Moiré patterns 105 are obtained by multiplying a captured interference pattern 104 by the reference Moire patterns 102 extracted from the memory 56, and are passed through the low-pass filter based on the table 103 extracted from the memory 56. Information (data) 106 thereby obtained is phase information from which a plurality of offset components having different initial phases are removed. A wavefront aberration 107 is obtained by processing the data 106. Therefore, the wavefront aberration 107 contains wavefront aberration information only about the projection optical system 16, but does not contain the offset components.

In the above-described electronic-Moiré measuring method, Steps 2002 and 2003 are performed only once beforehand, and only Step 2004 is performed in every measuring operation. Therefore, the time taken to perform one measuring operation in this method is equivalent to the time for Step 1004 shown in FIG. 4.

As described above, the exposure apparatus of the first embodiment includes the PDI wavefront-aberration measuring device in which the pinhole and the window, and the two pinholes are provided behind the optical system to be measured. In the measuring device, a wavefront aberration obtained by analyzing interference fringes produced by light beams passing through the pinhole and the window is corrected by a wavefront aberration obtained by analyzing interference fringes produced by light beams passing through the two pinholes. Consequently, it is possible to remove aberration components resulting from the ideal spherical wavefront of light passing through the pinholes and manufacturing error of the interferometer, and to precisely measure the wavefront aberration of the optical system.

Second Embodiment

An exposure apparatus including an LDI measuring device according to a second embodiment of the present invention will be described with reference to the attached drawings. While the exposure apparatus of the second embodiment is substantially similar to the exposure apparatus 100 of the first embodiment, it is different in that a first mask 60' and a second mask 70' are used instead of the first mask 60 and the second mask 70 in FIG. 1.

Figure 9:
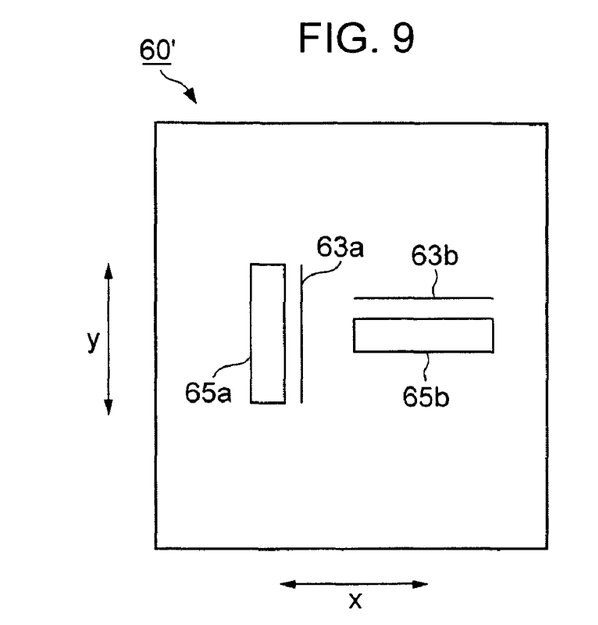
FIG. 9 is a schematic plan view of a first mask in a second embodiment of the present invention.

FIG. 9 is a schematic plan view showing the structure of the first mask 60' in the second embodiment. The first mask 60' includes a combination of a slit 63a and a window 65a extending in a 0-degree orientation (y-direction), and a combination of a slit 63b and a window 65b extending in a 90-degree orientation (x-direction). The combinations are the same in width and interval, but are different only in orientation. The width $\Delta_r$ of the slits 63a and 63b satisfies the above-described Conditional Expression 1 when $NA_r$ represents the numerical aperture of the projection optical system 16 on the reticle side, that is, on the object side.

When the width $\Delta_r$ of the slits 63a and 63b is set to satisfy Conditional Expression 1, diffracted light from the slits can be considered to be equiphase with respect to the numerical aperture $NA_r$. While the width $\Delta_{r'}$ of the windows 65a and 65b may be equivalent to the width $\Delta_r$, they are set to be a little larger from the viewpoint of the light amount because light beams passing through the windows 65a and 65b pass through slits having a width such as to satisfy the above-described Conditional Expression 2 on the substrate side, as will be described below, and therefore, the light beams do not need to be equiphase on the reticle side. The length of the slits 63a and 63b is more than the width $\Delta_r$ so that a certain amount of light can be obtained.

Figure 10:
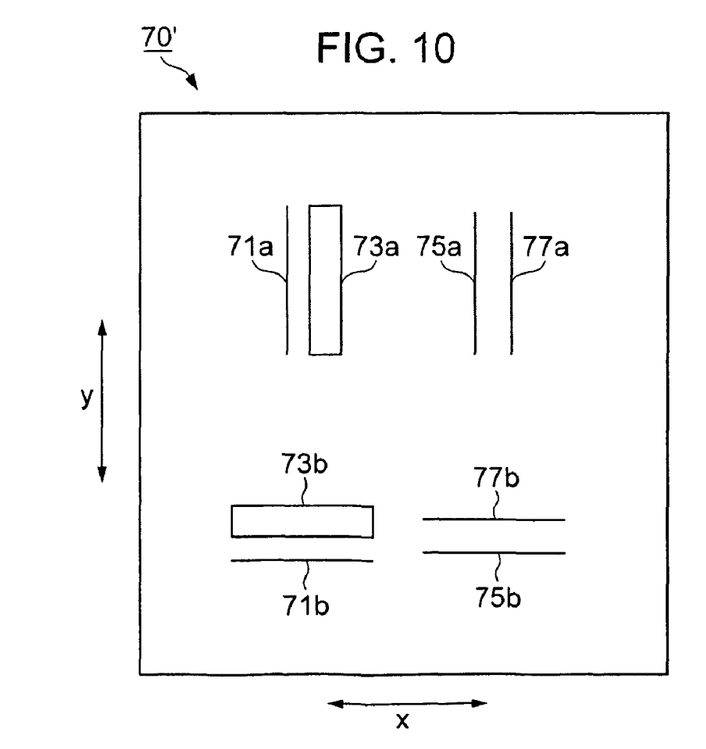
FIG. 10 is a schematic plan view of a second mask in the second embodiment.

FIG. 10 is a schematic plan view of the second mask 70'. As shown in FIG. 10, the second mask 70' includes a combination of slit 71a and a window 73a extending in a 0-degree orientation (y-direction), a pair of slits 75a and 77a extending in a 0-degree orientation (y-direction), a combination of a slit 71b and a window 73b extending in a 90-degree orientation (x-direction), and a pair of slits 75b and 77b extending in a 90-degree orientation (x-direction). The combination of the slit 71a and the window 73a and the combination of the slit 71b and the window 73b are the same in width and interval, but are different only in orientation. The pair of the slits 75a and 77a and the pair of the slits 75b and 77b are also the same in width and interval, but are different only in orientation. The interval between the slit 71a and the window 73a is equal to the interval between the slit 75a and the slit 77a, and the interval between the slit 71b and the window 73b is equal to the interval between the slit 75b and the slit 77b. The width $\Delta_w$ of the slits 71a, 71b, 75a, 75b, 77a, and 77b satisfies the above-described Conditional Expression 2 when $NA_s$ represents the numerical aperture of the projection optical system 16 on the substrate side, that is, on the image side.

When the width $\Delta_w$ of the slits 71a, 71b, 75a, 75b, 77a, and 77b is set to satisfy Conditional Expression 2, diffracted light from the slits can be considered to be equiphase with respect to the numerical aperture $NA_s$.

The width $\Delta_{w'}$ of the windows 73a and 73b is determined by the spatial frequency of the projection optical system 16 to be measured. The width $\Delta_{w'}$ is set to be large in order to measure spatial frequencies including high frequencies, and to be small in order to measure only low frequencies. The width $\Delta_{w'}$ is given by the above-described Expression 3 when f represents the spatial frequency at the pupil of the projection optical system 16.

While the length $L_w$ of the slits and the windows are preferably set to be as large as possible from the viewpoint of the light amount, it is necessary to set the length $L_w$ so that the aberration of the projection optical system 16 is fixed, that is, is less than a so-called isoplanatic region.

In the second embodiment, the second mask 70' includes the six slits 71a, 71b, 75a, 75b, 77a, and 77b. However, the slit 75a may be provided near the slit 71a, and the slit 75b may be provided near the slit 71b. In this case, the slits 77a and 77b can be omitted, and double-slit structures can be formed by the slits 71a and 75a, and the slits 71b and 75b.

Figure 11:
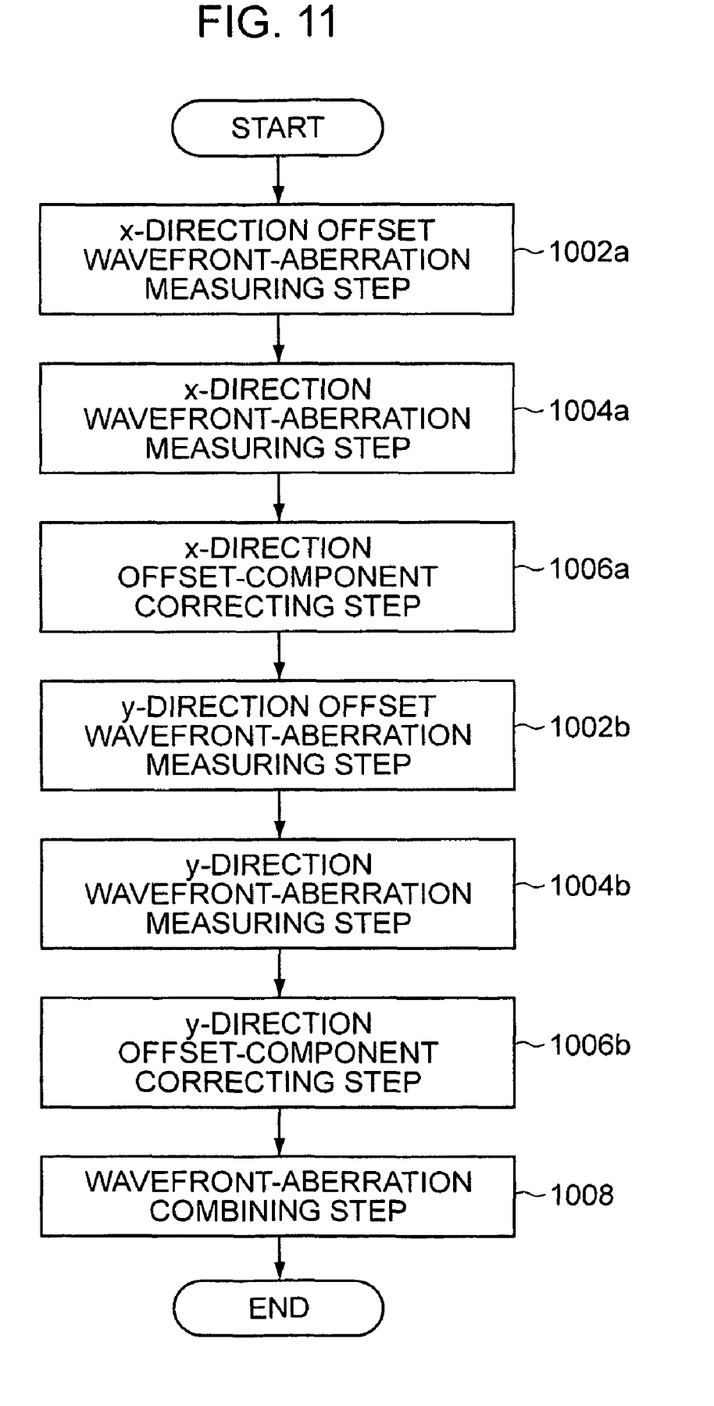
FIG. 11 is a flowchart showing the operation of a measuring device in the second embodiment.

FIG. 11 is a flowchart showing the operation of a measuring device (50a and 50b). The flowchart is different from the first embodiment in that the operation shown in FIG. 4 is performed in both the x-direction and the y-direction and in that a wavefront-aberration combining step is added. The operation of the measuring device in the second embodiment will be described below with reference to FIG. 11.

First, an x-direction offset wavefront aberration is measured in Step 1002a. Referring to FIG. 1, a light beam emitted from the light source 10 is routed to the illumination optical system 12 by the routing optical system 11. The size of the light beam from the routing optical system 11 is adjusted by the σ stop in the illumination optical system 12 so that the light beam is applied to the first mask 60'.

In Step 1002a, the unshown driving mechanism relatively moves the reticle stage 15 so that the light beam from the illumination optical system 12 is applied only to the slit 63a and the window 65a extending in a 0-degree orientation in the first mask 60'.

Since the width of the slit 63a satisfies the above Conditional Expression 1, diffracted light having an equiphase wavefront in the x-direction comes from the slit 63a. On the other hand, the light is hardly diffracted by the slit 63a in the y-direction or the longitudinal direction. Therefore, at least in the y-direction in FIG. 9, a light beam, whose numerical aperture is higher than or equal to the numerical aperture of the projection optical system 16 on the object side, that is, on the reticle side, is applied to the slit 63a. The light beam is thereby applied onto the entire optical pupil plane of the projection optical system 16. Moreover, the light beam has an equiphase wavefront in the x-direction. The slit 63a and the window 65a of the first mask 60' are imaged onto the second mask 70' disposed on the stage 18 by the projection optical system 16. The position of the second mask 70' is adjusted by driving the stage 18 so that the slit 63a and the window 65a of the first mask 60' are respectively imaged onto the slit 77a and the slit 75a of the second mask 70'.

Diffracted light beams passing through the slits 75a and 77a each have an equiphase spherical wavefront only in the x-direction. An interference pattern produced by interference between the light beams is captured by the image sensor 53, and is transmitted from the image sensor 53 to the controller 55 via the cable 54, and the controller 55 acquires phase information. The phase information is calculated from the interference pattern by, for example, Fourier transform, or a so-called electronic Moiré method (see Japanese Patent No. 02538435 and Japanese Patent Laid-Open No. 11-14322).

The wavefront aberration calculated in Step 1002a contains an aberration component produced depending on the wavefront shape of the light passing through the slits, and an aberration component produced by a medium lying between the second mask 70' and the image sensor 53. The wavefront aberration does not contain x-direction aberration information about the projection optical system 16 (x-direction offset wavefront aberration).

In Step 1004a, an x-direction measured wavefront aberration of the projection optical system 16 is obtained. Similarly to Step 1002a, a light beam from the illumination optical system 12 is applied only to the slit 63a and the window 65a that are provided in a 0-degree orientation in the first mask 60'.

Since the width of the slit 63a satisfies the above Conditional Expression 1, diffracted light having an equiphase wavefront in the x-direction comes from the slit 63a. The light is hardly diffracted by the slit 63a in the y-direction or the longitudinal direction. Therefore, a light beam, whose numerical aperture in the y-direction is higher than or equal to the numerical aperture of the projection optical system 16 on the object side, that is, on the reticle side, is applied to the slit 63a. The light beam is thereby applied onto the entire optical pupil plane of the projection optical system 16. Moreover, the light beam has an equiphase wavefront in the x-direction. The slit 63a and the window 65a of the first mask 60' are imaged onto the second mask 70' disposed on the stage 18 by the projection optical system 16. The position of the second mask 70' is adjusted by driving the stage 18 so that the slit 63a and the window 65a of the first mask 60' are respectively imaged onto the window 73a and the slit 71a of the second mask 70'.

Diffracted light from the slit 71a has an equiphase spherical wavefront only in the x-direction. In contrast, the light, whose wavefront is shaped by the slit 63a to be equiphase in the x-direction and which passes through the projection optical system 16, passes through the window 73a. Therefore, the light contains x-direction wavefront information about the projection optical system 16.

Accordingly, by finding phase information on the basis of an interference pattern captured by the image sensor 53, a wavefront aberration in which the x-direction aberration information about the projection optical system 16 is reflected can be obtained. The phase information is obtained from the interference pattern, for example, by Fourier transform or an electronic Moiré method.

The captured interference pattern is transferred from the image sensor 53 to the controller 55 via the cable 54, and the controller 44 acquires phase information. Since an interference pattern having carrier fringes is obtained in the second embodiment, it can be multiplied by carrier fringes generated by the controller 55, or prestored in the memory 56.

The x-direction measured wavefront aberration calculated in Step 1004a contains an x-direction aberration component of the projection optical system 16, an aberration component produced depending on the wavefront shape of the light passing through the slits, and an aberration component produced by the medium lying between the second mask 70' and the image sensor 53.

In Step 1006a, the x-direction measured wavefront aberration calculated in Step 1004a is corrected by the x-direction offset wavefront aberration calculated in Step 1002a, and the aberration components that do not result from the projection optical system 16 are removed. Consequently, it is possible to obtain a wavefront aberration containing only aberration information about the projection optical system 16 in the x-direction.

In Step 1002b, a y-direction offset wavefront aberration is measured. The unshown driving mechanism relatively moves the reticle stage 15 so that a light beam from the illumination optical system 12 is applied only to the slit 63b and the window 65b extending in a 90-degree operation in the first mask 60'.

Since the width of the slit 63b satisfies the above Conditional Expression 1, diffracted light having an equiphase wavefront in the y-direction comes from the slit 63b. On the other hand, the light is hardly diffracted by the slit 63b in the x-direction or the longitudinal direction. Therefore, at least in the x-direction in FIG. 9, a light beam, whose numerical aperture is higher than or equal to the numerical aperture of the projection optical system 16 on the object side, that is, on the reticle side, is applied to the slit 63b. The light beam is thereby applied onto the entire optical pupil plane of the projection optical system 16. Moreover, the light beam has an equiphase wavefront in the y-direction. The slit 63b and the window 65b of the first mask 60' are imaged onto the second mask 70' disposed on the stage 18 by the projection optical system 16. The position of the second mask 70' is adjusted by driving the stage 18 so that the slit 63b and the window 65b of the first mask 60' are respectively imaged onto the slit 77b and the slit 75b of the second mask 70'.

Diffracted light beams passing through the slits 75b and 77b each have an equiphase spherical wavefront only in the x-direction. An interference pattern is formed by the light beams, and is captured by the image sensor 53. The interference pattern is transmitted from the image sensor 53 to the controller 55 via the cable 54, and the controller 55 acquires phase information. The phase information is calculated from the interference pattern by, for example, Fourier transform or an electronic Moiré method.

The wavefront aberration calculated in Step 1002*b* contains an aberration component produced depending on the wavefront shape of the light passing through the slits, and an aberration component produced by the medium lying between the second mask 70' and the image sensor 53. The wavefront aberration does not contain y-direction aberration information about the projection optical system 16 (y-direction offset wavefront aberration).

In Step 1004*b*, a y-direction measured wavefront aberration of the projection optical system 16 is obtained. Similarly to Step 1002*b*, a light beam is applied from the illumination optical system 12 only to the slit 63*b* and the window 65*b* extending in a 90-degree orientation in the first mask 60'.

Since the width of the slit 63*b* satisfies the above Conditional Expression 1, diffracted light having an equiphase wavefront in the y-direction comes from the slit 63*b*. In contrast, the light is hardly diffracted by the slit 63*b* in the x-direction or the longitudinal direction. Therefore, at least in the x-direction in FIG. 9, a light beam, whose numerical aperture is higher than or equal to the numerical aperture of the projection optical system 16 on the object side, that is, on the reticle side, is applied to the slit 63*b*. The light beam is thereby applied onto the entire optical pupil plane of the projection optical system 16. Moreover, the light beam has an equiphase wavefront in the y-direction. On the other hand, the light beam passing through the window 65*b* contains aberration of the illumination optical system 12. The slit 63*b* and the window 65*b* of the first mask 60' are imaged onto the second mask 70' disposed on the stage 18 by the projection optical system 16. The position of the second mask 70' is adjusted by driving the stage 18 so that the slit 63*b* and the window 65*b* of the first mask 60' are respectively imaged onto the window 73*b* and the slit 71*b* of the second mask 70'.

Diffracted light passing through the slit 71*b* has an equiphase spherical wavefront only in the y-direction. In contrast, the light beam, whose wavefront is shaped by the slit 63*b* to be equiphase in the y-direction and which passes through the projection optical system 16, passes through the window 73*b*. Therefore, the light beam contains y-direction wavefront information about the projection optical system 16.

For this reason, when phase information is found on the basis of interference fringes captured by the image sensor 53, a wavefront aberration in which the y-direction aberration information about the projection optical system 16 is reflected is obtained. The phase information is obtained from the interference fringes, for example, by Fourier transform or an electronic Moiré method.

The captured pattern of the interference fringes is transmitted from the image sensor 53 to the controller 55 via the cable 54, and the controller 55 acquires phase information therefrom. Since an interference pattern having carrier fringes is obtained in the second embodiment, it can be multiplied by carrier fringes generated by the controller 55 or prestored in the memory 56.

The y-direction measured wavefront aberration calculated in Step 1004*b* contains a y-direction aberration component of the projection optical system 16, an aberration component produced depending on the wavefront shape of the light passing through the slit, and an aberration component produced by the medium lying between the second mask 70' and the image sensor 53.

In Step 1006*b*, the y-direction measured wavefront aberration calculated in Step 1004*b* is corrected by the y-direction offset wavefront aberration calculated in Step 1002*b*, and the aberration components that do not result from the projection optical system 16 are removed. Consequently, it is possible to obtain a wavefront aberration containing only aberration information about the projection optical system 16 in the y-direction.

The x-direction wavefront aberration of the projection optical system 16 obtained in Steps 1002*a* to 1006*a* and the y-direction wavefront aberration obtained in Steps 1002*b* to 1006*b* respectively have a correct phase relationship only in the x-direction and only in the y-direction.

Therefore, in Step 1008, the two wavefront aberrations are combined to obtain a wavefront aberration of the projection optical system 16 that has a correct phase relationship in both the x- and y-directions. The combination may be made by a well-known method, for example, a combining method proposed by the present inventor in Japanese Patent Application No. 2004-269731.

In the second embodiment, there is no need to perform all the steps 1002*a* to 1008 for each measuring operation, similarly to the first embodiment. For example, the x-direction offset wavefront aberration measured in Step 1004*a* and the y-direction offset wavefront aberration measured in Step 1004*b* may be stored in the memory 56 beforehand, and be extracted when Steps 1006*a* and 1006*b* are performed. In this case, it is unnecessary to perform Steps 1004*a* and 1004*b* in each measuring operation.

Alternatively, Steps 1002*a* and 1006*a* can be included in Step 1004*a*, and Steps 1002*b* and 1006*b* can be included in Step 1004*b* by performing image processing using an electronic Moiré method. That is, reference Moire patterns and a low-pass filter, in which the spatial frequency varies among pixels, are generated on the basis of information about an x-direction (or y-direction) offset wavefront aberration measured beforehand. By passing Moiré patterns obtained from an x-direction (or y-direction) measured pattern and the reference Moire patterns through the low-pass filter, offset component correction can be made.

The exposure apparatus of the second embodiment includes the LDI measuring device which measures the wavefront aberration and in which the slits, the windows, and the double slits are provided behind the optical system to be measured. In the measuring device, a wavefront aberration obtained by analyzing interference fringes produced by light beams passing through the slit and the window is corrected by a wavefront aberration obtained by analyzing interference fringes produced by light beams passing through the double slits. Consequently, aberration components resulting from the wavefront of light passing through the slit (ideal spherical wavefront only in one-dimensional direction) and manufacturing error of the interferometer can be removed, and the wavefront aberration of the optical system can be measured precisely.

While the preferred embodiments of the present invention have been described above, it is to be understood that the invention is not limited to the disclosed exemplary embodiments, and that various modifications are possible without departing from the scope of the invention.

For example, a part (50*b*) of the measuring device may be disposed on the upper side of an optical system to be measured, that is, on the reticle side, and an interference pattern produced by light reciprocates in the optical system and light having an ideal wavefront may be captured. In this case, preferably, a half mirror or a beam splitter is disposed to guide light, which has reciprocated in the optical system, to a second mask so that the light does not reenter a first mask provided instead of the reticle.

The interferometer may be configured so that light from the light source 10 enters a first mask disposed on the side of the substrate 17 through a fiber or the like, and then passes through an optical system to be measured (projection optical system 16) and a second mask disposed on the reticle side. That is, the interferometer may be configured so that light passes through the first mask, the optical system, and the second mask in that order.

Figure 4:
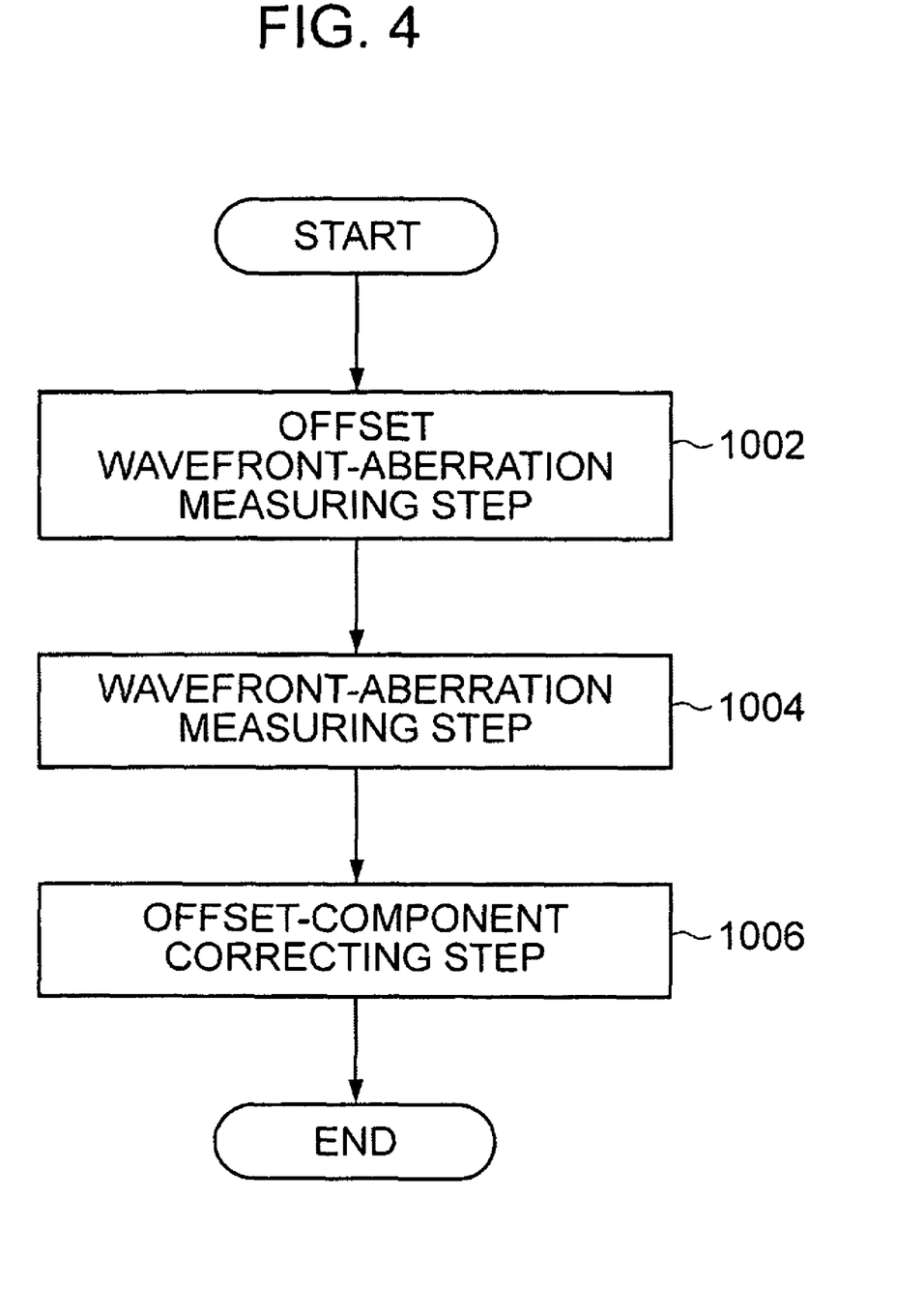
FIG. 4 is a flowchart showing the operation of a measuring device in the first embodiment.

The steps in the flowcharts of FIGS. 4 and 11 do not need to be performed in the orders shown in the figures. Step 1004 may be performed before Step 1002, and Steps 1002 and 1006 may be omitted, as described above.

In Step 1006 (or Step 1006a, Step 1006b), the measured wavefront aberration may be corrected by subtraction of aberration values at each point on the pupil plane. Of course, the wavefront aberration may be expressed in a Zernike polynomial, and subtraction may then be performed with respect to each term of the Zernike polynomial.

While the masks (first mask 60 and second mask 70) in the measuring device (50a, 50b) are illuminated by the illumination optical system 12 in the above embodiments, they may be illuminated by light from the alignment optical system 13.

While the measurement device is installed in the exposure apparatus in the above embodiments, it may not be installed therein.

While the step-and-scan exposure apparatus has been described above, the present invention is also applicable to a step-and-repeat exposure apparatus.

As many apparently widely different embodiments of the present invention can be made, it is to be understood that the invention is not limited to the specific embodiments thereof except as defined in the claims.

What is claimed is:

1. A measuring device for measuring a wavefront aberration of an optical system, the measuring device comprising:
   a first mask for defining light that enters the optical system;
   a second mask including a first opening and a plurality of further openings, the first opening transmitting a component of the light passing through the optical system including information about the wavefront aberration of the optical system, and the further openings transmitting components of the light passing through the optical system having the information about the wavefront aberration of the optical system removed;
   a detector for detecting a first interference pattern formed by interference between the light component passing through the first opening and the light component passing through one of the plurality of further openings and detecting a second interference pattern formed by interference between the light components passing through two of the plurality of further openings; and
   a controller for subtracting a wavefront aberration calculated from the detected second interference pattern from a wavefront aberration calculated from the detected first interference pattern
   wherein the further openings are slits, and the first opening is larger than the slits.

2. The measuring device according to claim 1, wherein the second mask includes second, third, and fourth openings as the further openings, and
   wherein the detector detects the first interference pattern formed by interference between the light component passing through the first opening and the light component passing through the second opening and detects the second interference pattern formed by interference between the light component passing through the third opening and the light component passing through the fourth opening.

3. The measuring device according to claim 2, wherein the second mask further includes:
   a fifth opening that transmits a component of the light passing through the optical system including the information about the wavefront aberration of the optical system; and
   sixth, seventh, and eighth openings that transmit components of the light passing through the optical system having the information about the wavefront aberration of the optical system removed,
   wherein the detector detects a third interference pattern formed by interference between the light component passing through the fifth opening and the light component passing through the sixth opening and detects a fourth interference pattern formed by interference between the light component passing through the seventh opening and the light component passing through the eighth opening,
   wherein the controller corrects a wavefront aberration calculated from the detected third interference pattern using a wavefront aberration calculated from the detected fourth interference pattern,
   wherein the sixth to eighth openings are slits, and the fifth opening is larger than the slits, and
   wherein the longitudinal direction of the fifth to eighth openings is perpendicular to the longitudinal direction of the first to fourth openings.

4. An exposure apparatus comprising:
   a projection optical system that projects a pattern image of a reticle onto a substrate; and
   a measuring device according to claim 1.

5. The exposure apparatus according to claim 4, wherein the second mask and the detector are disposed on a stage on which the substrate is provided.

6. The exposure apparatus according to claim 4, further comprising:
   a reticle stage for carrying the reticle,
   wherein the reticle stage is provided with a measuring reticle including the first mask.

7. The exposure apparatus according to claim 6, in which the first mask is placed on the reticle stage separately from the reticle.

8. A measuring method for measuring a wavefront aberration of an optical system, the measuring method comprising:
   a first setting step of setting a first mask for defining light that enters the optical system;
   a second setting step of setting a second mask including a first opening that transmits a component of the light passing through the optical system including information about the wavefront aberration of the optical system, and a plurality of further openings that transmit a component of the light passing through the optical system having the information about the wavefront aberration of the optical system removed so that light from the optical system passes through the first opening and one of the plurality of the further openings, wherein the further openings are slits, and the first opening is larger than the slits;
   a first detection step of detecting a first interference pattern formed by interference between the light component passing through the first opening and the light component passing through one of the plurality of the further openings;

a third setting step of setting the second mask so that light from the optical system passes through two of the plurality of the further openings;

a second detection step of detecting a second interference pattern formed by interference between the light components passing though two of the plurality of further openings; and a step of subtracting a wavefront aberration calculated from the detected second interference pattern from a wavefront aberration calculated from the detected first interference pattern.

9. The measuring method according to claim 8, wherein a first wavefront aberration containing the wavefront aberration of the optical system and measuring error is obtained from the first interference pattern, and wherein a second wavefront aberration containing the measuring error is obtained from the second interference pattern.

10. The measuring method according to claim 9, wherein a value in each term of a Zernike polynomial in which the second wavefront aberration is expressed is subtracted from a value in each term of a Zernike polynomial in which the first wavefront aberration is expressed.

11. The measuring method according to claim 8, wherein the second mask includes second, third, and fourth openings as the further openings, wherein the first interference pattern formed by interference between the light component passing through the first opening and the light component passing through second opening is detected in the first detection step, and wherein the second interference pattern formed by interference between the light component passing through the third opening and the light component passing through the fourth opening is detected in the second detection step.

* * * * *